(12) United States Patent
Simon et al.

(10) Patent No.: US 12,673,730 B2
(45) Date of Patent: Jul. 7, 2026

(54) BODYWORK ELEMENT COMPRISING A SURFACE FOR DISSIPATING ELECTRIC CURRENT

(71) Applicant: Flex-N-Gate France, Audincourt (FR)

(72) Inventors: Hervé Simon, Elancourt (FR); Hervé Roch, Montbeliard (FR)

(73) Assignee: FLEX-N-GATE FRANCE, Audincourt (FR)

( * ) Notice: Subject to any disclaimer, the term of this patent is extended or adjusted under 35 U.S.C. 154(b) by 367 days.

(21) Appl. No.: 18/264,699

(22) PCT Filed: Jan. 13, 2022

(86) PCT No.: PCT/FR2022/050075
§ 371 (c)(1),
(2) Date: Aug. 8, 2023

(87) PCT Pub. No.: WO2022/171941
PCT Pub. Date: Aug. 18, 2022

(65) Prior Publication Data
US 2024/0051609 A1 Feb. 15, 2024

(30) Foreign Application Priority Data
Feb. 10, 2021 (FR) ........................................ 2101239

(51) Int. Cl.
*B62D 25/12* (2006.01)
*B60R 16/06* (2006.01)
*H05K 9/00* (2006.01)

(52) U.S. Cl.
CPC .............. *B62D 25/12* (2013.01); *B60R 16/06* (2013.01); *H05K 9/0007* (2013.01)

(58) Field of Classification Search
CPC ...... B62D 25/12; B62D 25/10; B62D 29/005; B62D 25/105; B62D 29/001; H05K 9/0003; H05K 9/0007; B60R 16/06
See application file for complete search history.

(56) References Cited

U.S. PATENT DOCUMENTS 5,806,619 A * 9/1998 Kleinhoffer .......... B62D 25/105
180/69.2
6,445,568 B1 * 9/2002 Baur ................... B60R 16/0239
174/547
(Continued)

FOREIGN PATENT DOCUMENTS

DE 4221860 A1 1/1994
DE 102012010693 A1 * 12/2012 ............. B62D 25/04
(Continued)

OTHER PUBLICATIONS

International Search Report w/English translation for PCT/FR2022/050075 mailed Mar. 23, 2022, 5 pages.
(Continued)

*Primary Examiner* — Daniel J Colilla
(74) *Attorney, Agent, or Firm* — NIXON & VANDERHYE

(57) ABSTRACT

Disclosed is a bodywork part of a motor vehicle including a lining defining an internal volume intended for being closed by an outer skin, the lining consisting of an electrically non-conductive material. The bodywork element includes at least two internal structure elements arranged in the internal volume, between which a conductive surface of electrically conductive material is spread at a distance from the lining.

11 Claims, 2 Drawing Sheets

(56)                    References Cited

U.S. PATENT DOCUMENTS

| | | | | |
|---|---|---|---|---|
| 7,224,172 B1 * | 5/2007 | Brad | .................... | H05K 9/0003 |
| | | | | 324/627 |
| 2004/0036658 A1 * | 2/2004 | Schlieber | ............. | B62D 25/105 |
| | | | | 343/711 |
| 2007/0182649 A1 * | 8/2007 | Kondou | ................... | H01Q 1/52 |
| | | | | 343/841 |
| 2013/0049401 A1 * | 2/2013 | Song | ....................... | B23P 19/04 |
| | | | | 29/505 |

FOREIGN PATENT DOCUMENTS

| | | | | | | |
|---|---|---|---|---|---|---|
| FR | 3082803 | A3 | 12/2019 | | | |
| JP | 2005047354 | A | 2/2005 | | | |
| JP | 2009176827 | A * | 8/2009 | | | |
| JP | 2016120759 | A | 7/2016 | | | |
| WO | WO-0120963 | A1 * | 3/2001 | | .......... | H05K 9/0026 |
| WO | WO-2017083851 | A1 * | 5/2017 | | ............ | H02J 7/0013 |

OTHER PUBLICATIONS

Written Opinion of the ISA for PCT/FR2022/050075 mailed Mar. 23, 2022, 4 pages.

* cited by examiner

[Fig. 1]
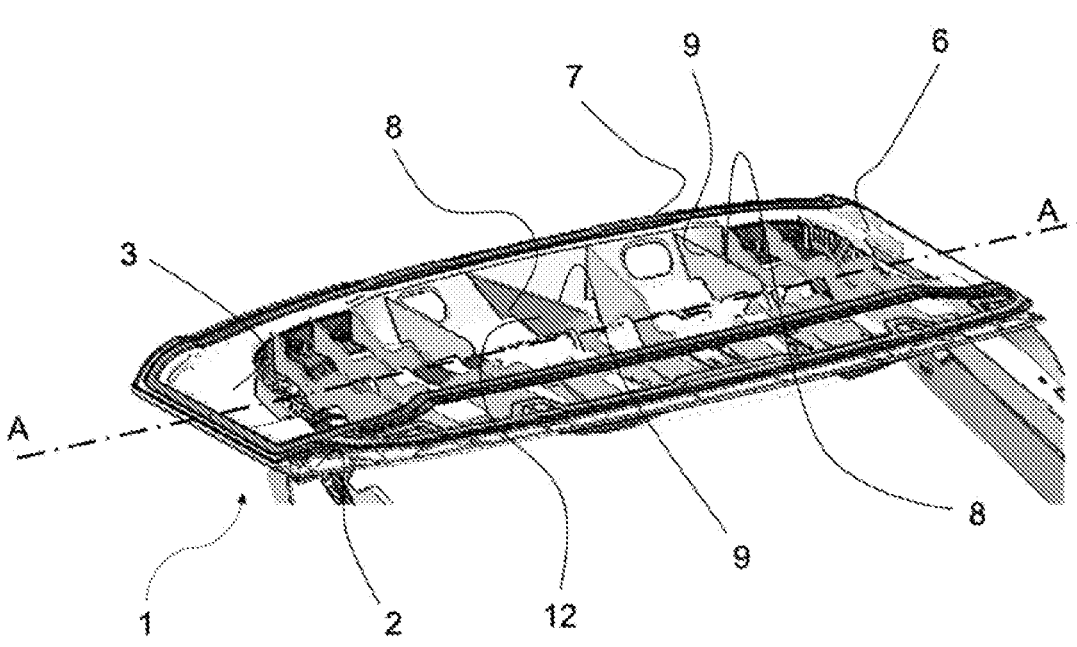
[Fig. 2]
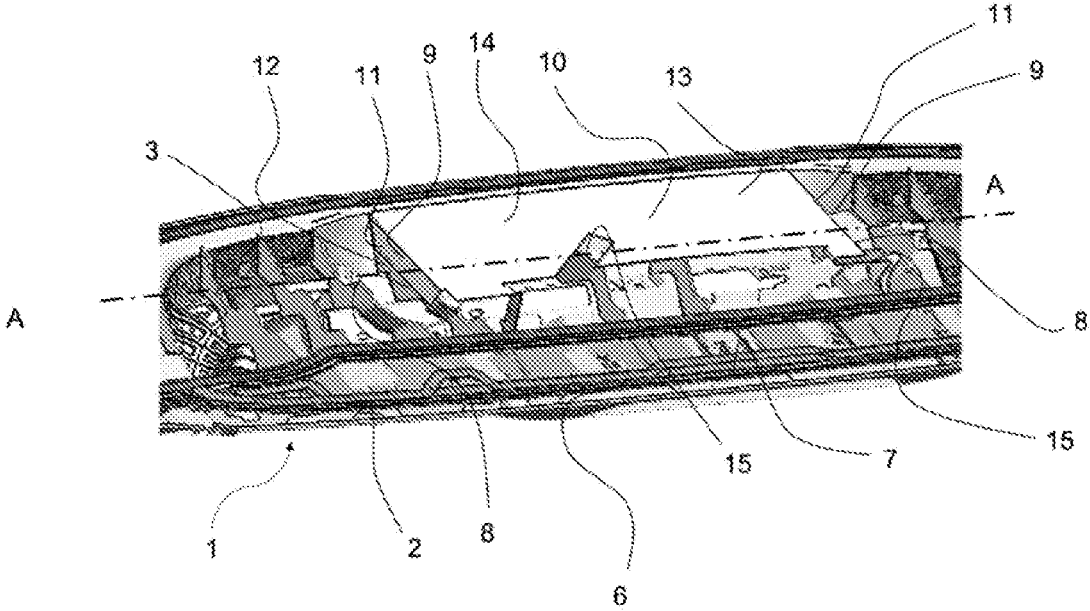

[Fig. 3]

BODYWORK ELEMENT COMPRISING A SURFACE FOR DISSIPATING ELECTRIC CURRENT

CROSS-REFERENCE TO RELATED APPLICATIONS

This application is the US national stage of PCT/FR2022/050075, filed Jan. 13, 2022 and designating the United States, which claims the priority of FR 2101239, filed Feb. 10, 2021. The entire contents of each foregoing application are incorporated herein by reference.

BACKGROUND OF THE INVENTION

Field of the Invention

The technical field relates to bodywork elements of a motor vehicle, in particular rear trunk lids, including a conductive surface for the purpose of dissipating electrical energy.

The present invention further relates to vehicles equipped with such bodywork elements.

Description of the Related Art

There is increasingly more and diversified electrical equipment installed on modern vehicles. However, the latter are liable to be disrupted by undesirable electric currents, of which the greatest possible quantity should be dissipated. Thereby radio antennas and many amplifiers are among the most sensitive electrical equipment to be protected, in order, in particular, to increase the qualities of on-board audio systems.

Conventional solutions for avoiding or dissipating undesirable electric currents involve metal braids, also called earth braids, which connect the electrical equipment to be protected to the metal car body of the vehicle. Such solutions involve in particular the use of electrically conductive hinges for the joints between the bodywork parts, in order to ensure the continuity of electrical conductivity. Indeed, it is common practice to arrange the electrical equipment to be protected in the opening elements and in particular the rear trunk lid.

Motor vehicle manufacturers are increasingly using bodywork parts made of plastic or composite materials for assembling the vehicles thereof because such materials have many advantages such as reduced implementation costs, a lighter weight or even more possibilities in terms of shapes. However, the use of such bodywork parts is likely to complicate the dissipation of unwanted electrical currents. To overcome the lack of electrical conductivity of such bodywork parts, car manufacturers are in the habit of adding metal sheets when molding bodywork parts. The addition of such metal sheets represents a significant additional cost and, in some cases, is simply impossible.

Thereby, there is a need for technical solutions making possible the integration of means of dissipation of undesirable electric currents for vehicles including bodywork parts made of electrically non-conductive material, while avoiding the conventional solutions, described hereinabove, which are too complex and costly to implement.

SUMMARY OF THE INVENTION

The subject matter of the present invention is to overcome the problems described hereinabove. In such technical context, a goal of the present invention is to provide a bodywork element for dissipating undesirable electric currents in order to protect at least one piece of electrical equipment to be protected, while reducing the manufacturing costs.

To this end, the present invention relates to a bodywork element of a motor vehicle comprising a lining defining an internal volume intended to be closed by an external skin, the lining consisting of electrically non-conductive material and the bodywork element including at least two internal structure elements arranged in the internal volume, between which a conductive surface of electrically conductive material is spread at a distance from the lining, so as to let the electrical energy dissipate.

The invention further relates to a trunk lid including a bodywork element according to the invention, comprising an outer skin assembled on the lining.

Finally, the invention relates to a vehicle including a trunk lid according to the invention.

Thereby, the bodywork element according to the invention makes it possible to obtain a trunk lid which is apt to dissipate all or part of an undesirable electric current even if the bodywork element consists of an electrically non-conductive material. Indeed, the conductive surface, arranged in the internal space of the lining, is apt to dissipate an undesirable electric current at least in part. But undesirable electric currents are likely to generate electromagnetic interference. A bodywork element consisting of non-conductive material means that the bodywork element according to the invention indifferently consists of one or a plurality of materials.

Moreover, it is easy to attach, in particular by bonding, the conductive surface by spreading same between at least two of the internal structure elements. For the above reason, by spreading the conductive surface between two internal structure elements, it is not necessary to resort to the addition of a metal sheet at the time of molding the lining. Thereby, the bodywork element according to the invention is simple and inexpensive to produce and makes it possible to obtain a sufficiently large conductive surface in order to dissipate all or part of an undesirable current. Spreading a conductive surface between at least two internal structure elements, at a distance from the lining, makes it possible to dispense with the complex shapes and volumes of the lining.

According to one embodiment of the invention, at least one of the internal structure elements is a rib for reinforcing the lining. The presence of one or a plurality of ribs is frequent in linings intended for bodywork parts, so that little or no modifications are needed for obtaining a bodywork element according to the invention from a lining.

According to one embodiment, the conductive surface consists of at least one sheet of conductive material. By conductive material, it is understood that the sheet can consist of one or a plurality of materials. A sheet of electrically conductive material is easy to spread and attach between two internal structure elements. In addition, a sheet of conductive material, in particular a metal sheet such as an aluminum sheet, is readily available and inexpensive. Advantageously, the metal film is stretched between the two internal structure elements: during assembly, the operator simply has to stretch the film and affix same to the internal structure elements for attaching the film, e.g. bonding same.

Advantageously, each sheet of conductive material is a metal film reinforced by a plastic film. Such a plastic film reinforces the metal film and thereby prevents, during assembly, any tearing of the bodywork element or of the trunk lid.

According to one embodiment, the conductive surface is electrically connected to at least one tab intended for providing electrical continuity between the conductive surface and at least one piece of electrical equipment to be protected from an undesirable electrical current. Each tab is used to electrically connect, either directly or indirectly, the electrical equipment to be protected to the conductive surface, for conveying an unwanted electrical current to the conductive surface.

Advantageously, at least one tab extends through the lining.

According to one embodiment, the outer skin is bonded onto a bonded zone arranged on a periphery of the lining and is distinct from the internal structure elements. Thereby, the conductive surface is suspended in the internal space, between the lining and the exterior skin of the trunk lid.

BRIEF DESCRIPTION OF THE DRAWINGS

The invention will be better understood upon reading the following description, given only as an example, but not limited to, and making reference to the enclosed drawings wherein:

FIG. 1 is a perspective view of a lining used for producing a bodywork element according to the invention and illustrates internal structure elements used for forming the bodywork element according to the invention;

FIG. 2 is a perspective view of the bodywork element produced from the lining shown in FIG. 1;

FIG. 3 is a longitudinal sectional view along an axis AA, shown in FIGS. 1 and 2, of a trunk lid obtained from the bodywork component shown in FIG. 2;

DETAILED DESCRIPTION

In said figures, the same references are used for identifying the same elements.

Figure 3:
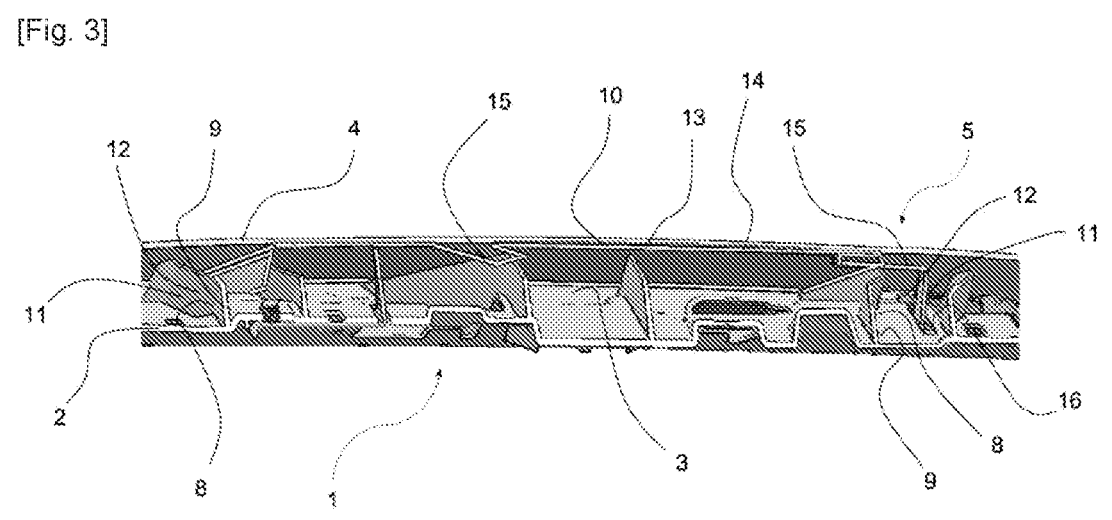

A bodywork element 1 according to the invention, shown in FIG. 2, comprises a lining 2, represented in FIGS. 1 and 2, which defines an internal volume 3 intended for being closed by an external skin 4, shown in FIG. 3. The lining 2 along with the outer skin 4 attached e.g. by adhesive bonding to the lining 2, form a trunk lid 5, shown in FIG. 3, in particular a rear trunk lid 5 of a motor vehicle according to the invention, not shown in the figures. The lining 2 and the lid 5 have a longitudinal extension along an axis AA, shown in FIGS. 1 and 2. In order to assemble the outer skin 4 on the lining 2, the latter has a bonding zone 6 arranged on a periphery of the lining 2. During assembly, a bead of adhesive 7 is thus placed on the lining 2 and then the outer skin 4 is pressed against the bead of adhesive 7. The lining 2 is made of electrically non-conductive material. It is specified that the lining 2 consists indifferently of one or a plurality of non-conductive materials. For example, the lining 2 is composed of one or a plurality of plastics. The bodywork element 1 according to the invention further includes at least two internal structure elements 8, shown in FIG. 1, arranged in the internal volume 3. The internal structure elements 8 form an integral part of the lining 2 in the example shown in the figures but could also be directly mounted thereto by bonding and/or any other means of attachment. In the example illustrated in FIG. 1, each internal structure element 8 forms a rib 9 intended for reinforcing the lining 2.

The bodywork element 1 according to the invention further includes a conductive surface 10 made of an electrically conductive material, visible in FIGS. 2 and 3, designed for dissipating all or part of an electric current flowing therethrough. It should be understood that the conductive surface 10 indifferently consists of one or a plurality of materials. The conductive surface 10 spreads between at least two of the internal structure elements 8, at a distance from the lining 2 between said internal structure elements 8. The conductive surface 10 is attached onto the internal structure elements 8. Such attachment of the conductive surface 10 is obtained e.g. by bonding. To this end, the conductive surface 10 advantageously has flaps 11, visible in FIGS. 2 and 3, folded down onto a lateral face 12 of the internal structure elements 8, one of which is visible in FIG. 2, in order to improve the attachment of the conductive surface 10 on the internal structure elements 8. The conductive surface 10 is easily formed by means of a sheet 13 of conductive material, in particular by a metal film 14. For this purpose, an aluminum film is particularly suitable for forming the conductive surface 10. Advantageously, the metal film 14 forming the conductive surface 10 is reinforced by a plastic film bonded to the metal film 14. Such a reinforcement using a plastic film prevents the tearing of the metal film 14 during the assembly of the bodywork element 1. For an optimum protection of the metal film 14, the plastic film completely covers one face of the metal film 14. Advantageously, the metal film 14 is stretched between the internal structure elements 8.

Advantageously, the conductive surface 10 is electrically connected to at least one tab 15 intended for providing electrical continuity between the conductive surface 10 and at least one piece of electrical equipment, not shown in the figures, which has to be protected from an undesirable electric current which is usually a source of electromagnetic interference. Thereby, each tab 15 makes it possible to convey an undesirable electric current from a piece of electrical equipment to be protected towards the conductive surface 10 which contributes to dissipating, at least in part, the undesirable electric current. In the example shown in the figures, the bodywork element 1 includes two tabs 15. Advantageously, the tabs 15 are formed by an extension of the conductive surface 10. If need be, in particular when the electrical equipment to be protected is arranged outside the internal volume 3, at least one tab 15 extends through the lining 2, e.g. through holes 16, one of which is shown in FIG. 3, provided for this purpose in the lining 2.

Thereby, the bodywork element 1 according to the invention makes it possible to obtain a trunk lid 5 apt to dissipate all or part of an undesirable electric current by means of the conductive surface 10, even if the bodywork element 1 consists of electrically non-conductive material(s). The conductive surface 10, arranged in the internal space 3 of the lining 2, makes possible an easy installation despite the size and complexity of the internal volume 3. The procedure for assembling a bodywork element 1 is easy and represents an appreciable economic saving.

As illustrated in FIG. 3, to form the trunk lid 5 according to the invention, the outer skin 4 is bonded to the bonding zone 6 which is preferentially distinct from the internal structure elements 8, so that the metal film 14 is also spread at a distance from the outer skin 4.

The invention is not limited to the embodiment of the bodywork element 1 or of the trunk lid 5 described hereinabove, given only as an example. Other embodiments can be designed by the person skilled in the art without departing from the framework and scope of the present invention.

The invention claimed is:

1. A bodywork component of a motor vehicle, the bodywork component comprising:

a lining defining an internal volume configured to be closed by an outer skin, the lining consisting of electrically non-conductive material; and at least two internal structure elements disposed in the internal volume, between which a conductive surface of electrically conductive material is spread at a distance from the lining to let electrical energy dissipate, the conductive surface being disposed in the internal volume of the lining.

2. The bodywork element according to claim 1, wherein at least one of the internal structure elements is a rib configured to reinforce the lining.

3. The bodywork element according to claim 1, wherein the conductive surface consists of at least one sheet of conductive material.

4. The bodywork element according to claim 3, wherein each sheet of conductive material is a metal film reinforced by a plastic film.

5. The bodywork element according to claim 1, wherein the conductive surface is electrically connected to at least one tab configured to provide electrical continuity between the conductive surface and at least one piece of electrical equipment to be protected from unwanted electrical current.

6. The bodywork element according to claim 5, wherein at least one tab extends through the lining.

7. A trunk lid comprising:

the bodywork element according to claim 1; and an outer skin assembled on the lining.

8. The lid according to claim 7, wherein the outer skin is bonded to a bonding zone disposed on a periphery of the lining and is distinct from the internal structure elements.

9. A vehicle comprising:

the trunk lid according to claim 7.

10. The bodywork element according to claim 1, wherein the conductive surface is attached onto the internal structure elements.

11. A bodywork component of a motor vehicle comprising:

a lining defining an internal volume configured to be closed by an outer skin, the lining consisting of electrically non-conductive material; and at least two internal structure elements disposed in the internal volume, between which a conductive surface of electrically conductive material is spread at a distance from the lining to let electrical energy dissipate, wherein the conductive surface is electrically connected to at least one tab configured to provide electrical continuity between the conductive surface and at least one piece of electrical equipment to be protected from unwanted electrical current, the at least one tab extending through the lining.

* * * * *